(12) United States Patent
Ahmed et al.

(10) Patent No.: US 11,275,245 B2
(45) Date of Patent: Mar. 15, 2022

(54) LIGHT EMITTING DISPLAY

(71) Applicant: Intel Corporation, Santa Clara, CA (US)

(72) Inventors: Khaled Ahmed, Anaheim, CA (US); Ali Khakifirooz, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 16/473,983

(22) PCT Filed: Mar. 30, 2017

(86) PCT No.: PCT/US2017/025111
§ 371 (c)(1),
(2) Date: Jun. 26, 2019

(87) PCT Pub. No.: WO2018/182634
PCT Pub. Date: Oct. 4, 2018

(65) Prior Publication Data
US 2019/0346680 A1 Nov. 14, 2019

(51) Int. Cl.
*G02B 27/01* (2006.01)
*H01L 27/15* (2006.01)
(Continued)

(52) U.S. Cl.
CPC ....... *G02B 27/0172* (2013.01); *G02B 27/017* (2013.01); *G09G 3/32* (2013.01);
(Continued)

(58) Field of Classification Search
CPC .............. G02B 27/017; G02B 27/0172; G02B 2027/0178; G09G 3/32; H01L 33/0075;
(Continued)

(56) References Cited

U.S. PATENT DOCUMENTS 9,653,642 B1 * 5/2017 Raring .............. H01L 29/66916
9,829,710 B1 * 11/2017 Newell ............. G02B 27/0176
(Continued)

FOREIGN PATENT DOCUMENTS

KR 10-0965253 B1 6/2010

OTHER PUBLICATIONS

International Search Report and Written Opinion dated Dec. 27, 2017 for International Application No. PCT/US2017/025111, 13 pages.

*Primary Examiner* — Jason M Mandeville
(74) *Attorney, Agent, or Firm* — Schwabe, Williamson & Wyatt, P.C.

(57) ABSTRACT

Embodiments of the present disclosure describe light emitting displays having a light emitter layer that includes an array of light emitters and a wafer having a driving circuit coupled with the light emitter layer, computing devices incorporating the light emitting displays, methods for formation of the light emitting displays, and associated configurations. A light emitting display may include a light emitter layer that includes an array of light emitters and a wafer coupled with the light emitter layer, where the wafer includes a driving circuit formed thereon to drive the light emitters. Other embodiments may be described and/or claimed.

21 Claims, 8 Drawing Sheets

(51) Int. Cl.
  *H01L 27/32* (2006.01)
  *H01L 21/02* (2006.01)
  *H01L 33/00* (2010.01)
  *G09G 3/32* (2016.01)
  *H01L 33/62* (2010.01)
  *H01L 25/075* (2006.01)

(52) U.S. Cl.
  CPC .. *H01L 21/02002* (2013.01); *H01L 21/02104* (2013.01); *H01L 21/02365* (2013.01); *H01L 21/02367* (2013.01); *H01L 27/153* (2013.01); *H01L 27/156* (2013.01); *H01L 27/32* (2013.01); *H01L 27/3206* (2013.01); *H01L 27/3211* (2013.01); *H01L 27/3241* (2013.01); *H01L 33/0075* (2013.01); *G02B 2027/0178* (2013.01); *H01L 25/0753* (2013.01); *H01L 27/3209* (2013.01); *H01L 33/62* (2013.01)

(58) Field of Classification Search
  CPC ..... H01L 33/62; H01L 27/153; H01L 27/156; H01L 27/32; H01L 27/3209; H01L 27/3211; H01L 27/3206; H01L 27/3241; H01L 21/02002; H01L 21/02365; H01L 21/02104; H01L 21/02367; H01L 25/0753
  USPC .................................................. 345/8, 76, 82
  See application file for complete search history.

(56) References Cited

U.S. PATENT DOCUMENTS

| | | | |
|---|---|---|---|
| 10,964,665 B2* | 3/2021 | Ray | H01L 24/25 |
| 2007/0035241 A1 | 2/2007 | Abe | |
| 2011/0164646 A1* | 7/2011 | Maeda | H01S 5/423 |
| | | | 372/50.11 |
| 2012/0168715 A1 | 7/2012 | Horng et al. | |
| 2014/0048828 A1 | 2/2014 | Yang et al. | |
| 2014/0184724 A1 | 7/2014 | Cho | |
| 2017/0025399 A1* | 1/2017 | Takeya | H05B 33/12 |
| 2017/0025484 A1* | 1/2017 | Forrest | H01L 51/56 |

* cited by examiner

LIGHT EMITTING DISPLAY

CROSS REFERENCE TO RELATED APPLICATION

The present application is a national phase entry under 35 U.S.C. § 371 of International Application No. PCT/US2017/025111, filed Mar. 30, 2017, entitled "LIGHT EMITTING DISPLAY." PCT/US2017/025111 designated, among the various States, the United States of America. The Specification of the PCT/US2017/025111 Application is hereby incorporated by reference.

TECHNICAL FIELD

The present disclosure relates generally to the field of light emitting displays for electronic devices and, more specifically, to light emitting microdisplays.

BACKGROUND

Legacy approaches to fabricating light emitting displays typically do not provide one or more characteristics such as high pixel density, high brightness, high contrast, low power operation, and/or compact form factor that may be desirable in applications such as augmented reality (AR) and/or virtual reality (VR) head mounted displays.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
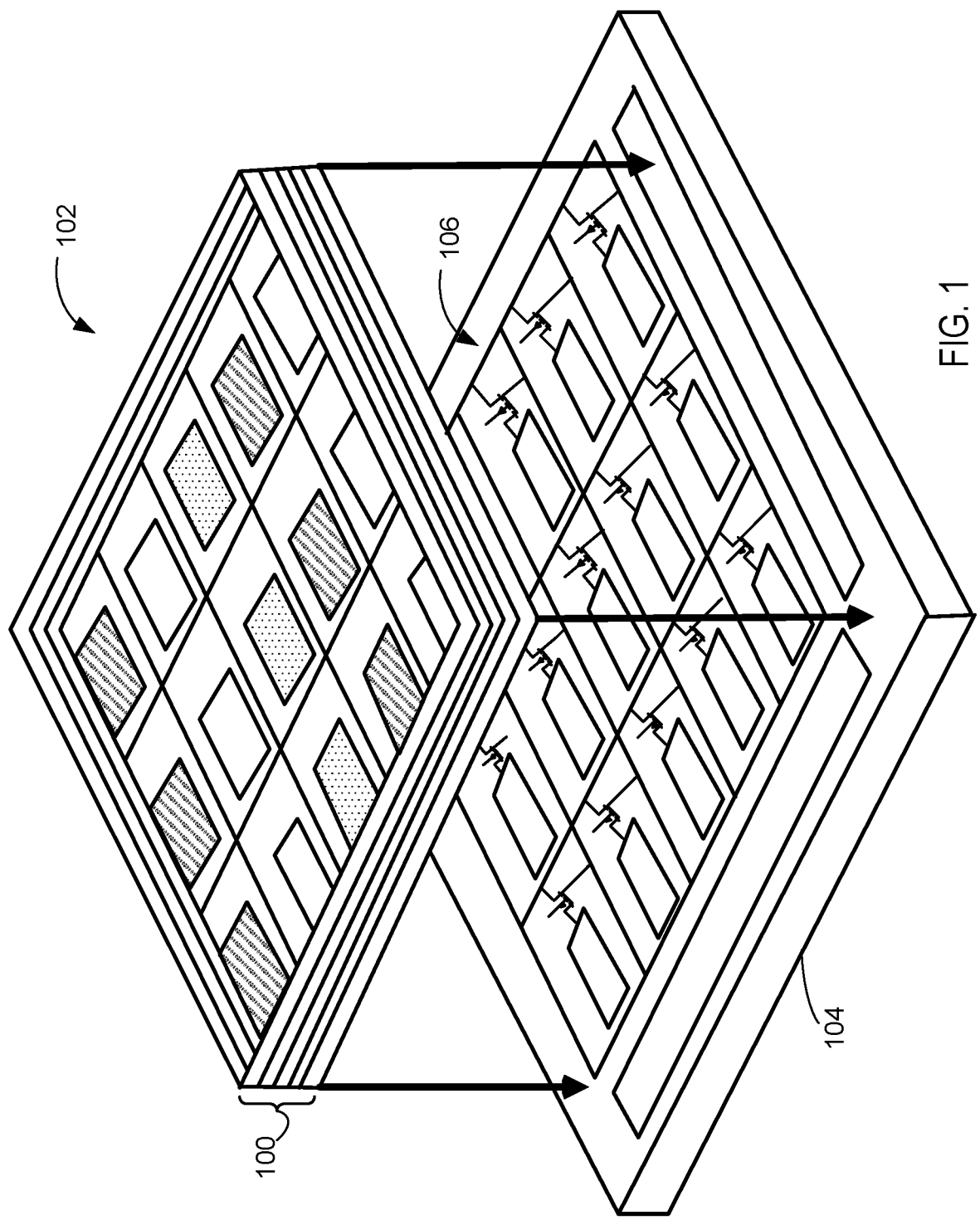
FIG. 1 schematically illustrates a first wafer assembly having an array of light emitters and a second wafer assembly having a driving circuit before wafer bonding to form a light emitting display, in accordance with various embodiments.

Embodiments herein may include light emitting displays having a light emitter layer that includes an array of light emitters and a wafer coupled with the light emitter layer, where the wafer includes a driving circuit formed thereon to drive the light emitters. In some embodiments, the light emitting display may be a microdisplay formed by wafer bonding a first wafer having a light emitter layer to a second wafer having a driving circuit.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

FIG. 1 schematically illustrates a first wafer assembly 100 having an array of light emitters 102 and a second wafer assembly 104 having a driving circuit 106, details not shown for clarity, before wafer bonding to form a light emitting display, in accordance with various embodiments. Arrows between the first wafer assembly 100 and the second wafer assembly 104 are shown to indicate a placement direction of the first wafer assembly 100 on the second wafer assembly 104 during wafer bonding, according to some embodiments.

Figure 2:
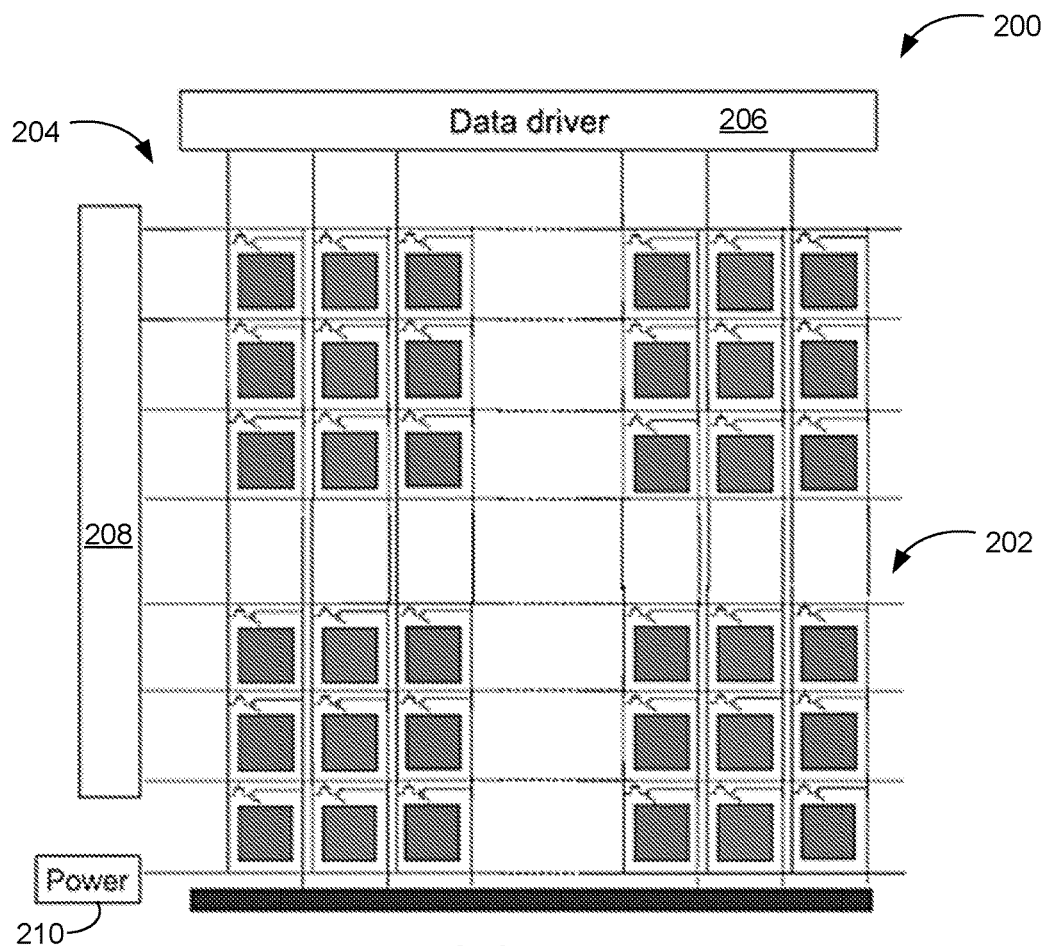
FIG. 2 schematically illustrates a light emitting display, in accordance with various embodiments.

FIG. 2 schematically illustrates a light emitting display 200, in accordance with various embodiments. In some embodiments, the light emitting display 200 may include an array of light emitters 202 and a driving circuit 204 that may include a data driver 206, a scan driver 208, and drive circuitry, not labeled for clarity, to drive individual light emitters in the array of light emitters 202. A power source 210 may be coupled with the driving circuit 204 in various embodiments. In embodiments, some or all of the light emitting display 200 may be formed from the bonded first wafer assembly 100 and second wafer assembly 104 of FIG. 1. In various embodiments, the array of light emitters 202 may correspond to the array of light emitters 102 and the driving circuit 106 may be included in the driving circuit 204. In some embodiments, the light emitting display 200 may be a microdisplay having a diagonal measurement of less than or equal to approximately 2 inches. In various embodiments, the light emitting display 200 may have a diagonal measurement of less than or equal to approximately 1 inch.

Figure 3:
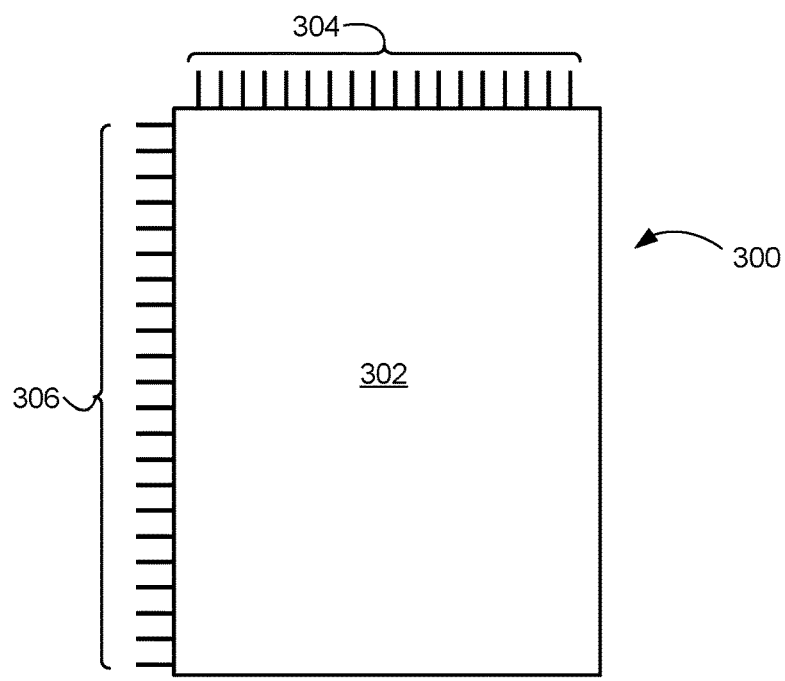
FIG. 3 schematically illustrates a top view of a portion of a light emitting display, in accordance with various embodiments.

FIG. 3 schematically illustrates a top view of a portion of a light emitting display 300, in accordance with various embodiments. In some embodiments, the light emitting display 300 may include a display area 302 that may include an array of light emitters (e.g., array of light emitters 102 or 202). In various embodiments, the light emitting display 300 may include a first set of interconnects 304 and a second set of interconnects 306. In some embodiments, the first set of interconnects 304 may be electrically coupled with anodes of the light emitters in the display area 302 and/or the second set of interconnects 306 may be electrically coupled with cathodes of the light emitters in the display area 302. In various embodiments, the first set of interconnects 304 may be coupled with a first driver (e.g., data driver 206), not shown for clarity, and the second set of interconnects 306 may be coupled with a second driver (e.g., scan driver 208), not shown for clarity.

In some embodiments, the first driver and/or the second driver may be included in drive circuitry (e.g., driving circuit 106 or 204) of a wafer bonded to the array of light emitters. In other embodiments, the first driver and/or the second driver may be external to the wafer with the drive circuitry, where the first set of interconnects 304 and/or the second set of interconnects 306 may be used to couple the drive circuitry to one or more drivers that are external to the wafer assembly (e.g., on a separate driver IC). In embodiments, the first set of interconnects 304 and/or the second set of interconnects 306 may include metal pads for connection to one or more integrated circuits external to a wafer assembly that includes the display area 302. In some embodiments, the light emitting display 300 may correspond to a portion of the light emitting display 200 of FIG. 2.

Figure 4A:
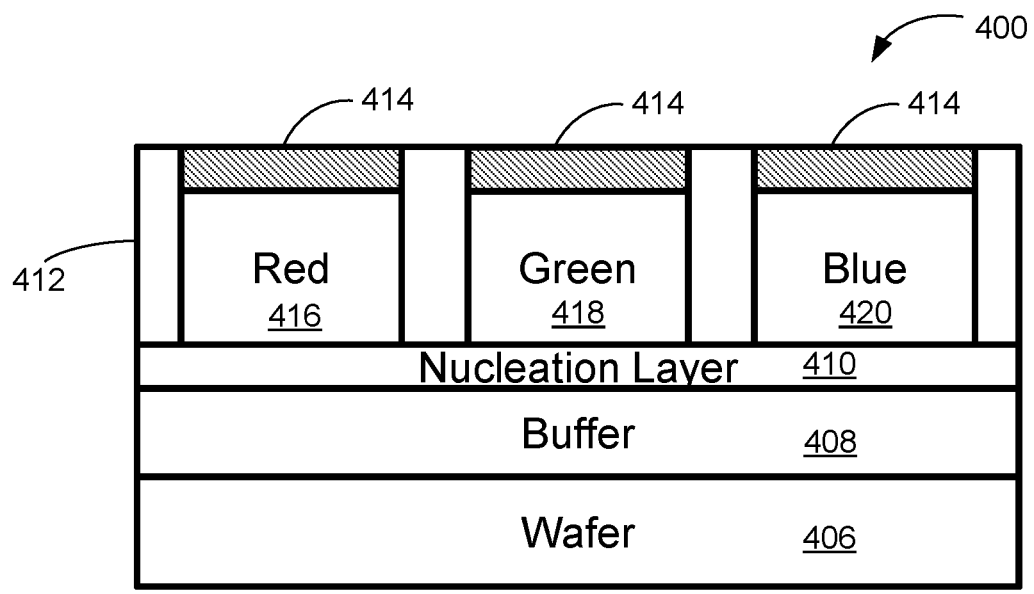
FIGS. 4A and 4B schematically illustrate a cross-sectional side view of a first wafer assembly having an array of light emitters and a second wafer assembly having a driving circuit before wafer bonding to form a light emitting display, in accordance with various embodiments.
Figure 4B:
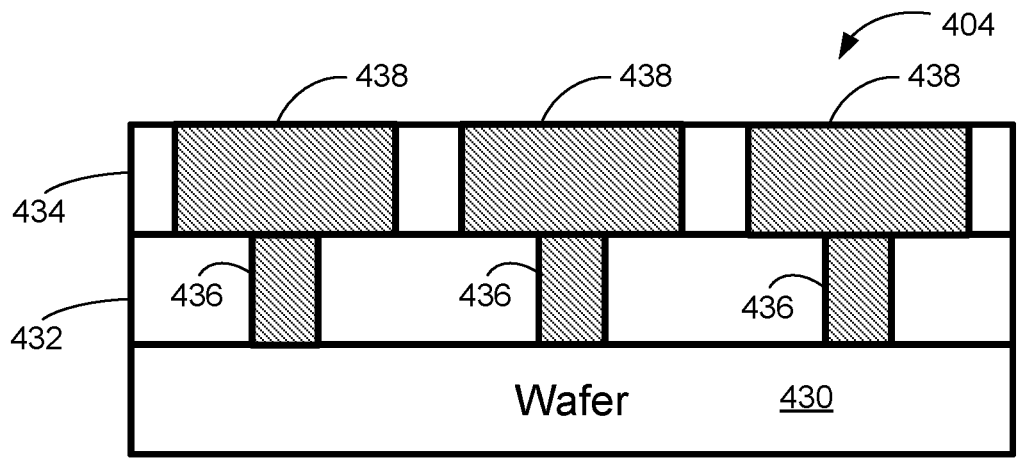

FIGS. 4A and 4B schematically illustrate a cross-sectional side view of a first wafer assembly 400 having an array of light emitters 402 and a second wafer assembly 404 having a driving circuit, not shown for clarity, before wafer bonding to form a light emitting display, in accordance with various embodiments. In some embodiments, the first wafer 400 may correspond to the first wafer assembly 100 and the second wafer assembly 404 may correspond to the second wafer assembly 104 of FIG. 1. In various embodiments, the first wafer assembly 400 may include a wafer 406 that may be a handle wafer, a buffer layer 408 (e.g., aluminum nitride (AlN), aluminum gallium nitride (AlGaN)), and a nucleation layer 410. In some embodiments, the wafer 406 may be a 300 millimeter (mm) silicon wafer. However, other materials (e.g., sapphire, silicon carbide, gallium nitride) and/or sizes may be used for the wafer 406 in various embodiments. In some embodiments, the array of light emitters 402 may be included in an interlayer dielectric layer 412. In embodiments, the interlayer dielectric layer 412 may be an oxide layer. In various embodiments, the first wafer assembly 400 may also include metal regions 414 that may serve as anodes for light emitters in the array of light emitters 402. In some embodiments, the metal regions 414 may be formed of copper (Cu). However, other metals or other conductive materials may be used for the metal regions 414 in various embodiments.

In some embodiments, the array of light emitters 402 may include an array of pixels that may each include more than one light emitter of different colors, such as a red light emitter 416, a green light emitter 418, and a blue light emitter 420. A different number of colors, or different colors, may be used for the pixels in various embodiments. In some embodiments, the array of light emitters 402 may have greater than or equal to approximately 2000 pixels per inch (PPI) and in various embodiments, may have greater than or equal to approximately 3000 PPI. The array of light emitters 402 may have a different PPI in other embodiments. In some embodiments, the light emitters may be light emitting diodes (LEDs). In various embodiments, the light emitters may be monolithically manufactured LEDs. In embodiments, the light emitters may be organic LEDs. However, other types of LEDs (e.g., micro pyramids or nanowire LEDs) or other types of light emitters may be used in various embodiments. In some embodiments, the LED active layers may be made of Indium Gallium Nitride (InGaN), where differing Indium compositions may correspond to different colors. In various embodiments, the blue emitter 420 may have an Indium composition of approximately between 17.8% and 19.5%, the green emitter 418 may have an Indium composition of approximately between 30% and 30.8%, and/or the red emitter 416 may have an Indium composition of approximately between 39.6% to 41.2%. In some embodiments, the array of light emitters 402 may be a micro LED array having a pitch of less than approximately 5 micrometers (μm).

In some embodiments, the second wafer assembly 404 may include a wafer 430, a first interlayer dielectric layer 432, and a second interlayer dielectric layer 434. In embodiments, the first interlayer dielectric layer 432 and/or the second interlayer dielectric layer 434 may be oxide layers. In various embodiments, vias 436 may run through the first interlayer dielectric layer 432 and/or metal regions 438 may be located in the second interlayer dielectric layer 434. In some embodiments, the metal regions 438 may be formed of copper (Cu). However, other metals or other conductive materials may be used for the metal regions 438 in various embodiments. In some embodiments, the wafer 430 may be a 300 mm Silicon wafer. However, other sizes and/or types of materials (e.g., sapphire, silicon carbide, gallium nitride) may be used for the wafer 430 in various embodiments. In various embodiments, the wafer 430 may be prepared with driver circuit arrays, not shown for clarity, that correspond to the array of light emitters 402 (e.g., micro LED arrays) on the first wafer 406. In some embodiments, the driver circuit arrays may be formed of complementary metal oxide semiconductor (CMOS) devices (e.g., in a 22 nanometer (nm) node, 32 nm node, 45 nm node, 65 nm node, 130 nm node, or 180 nm node). In other embodiments, the driver circuit arrays may be formed of devices using thin film transistor (TFT) technology or some other device fabrication technology.

Figure 5:
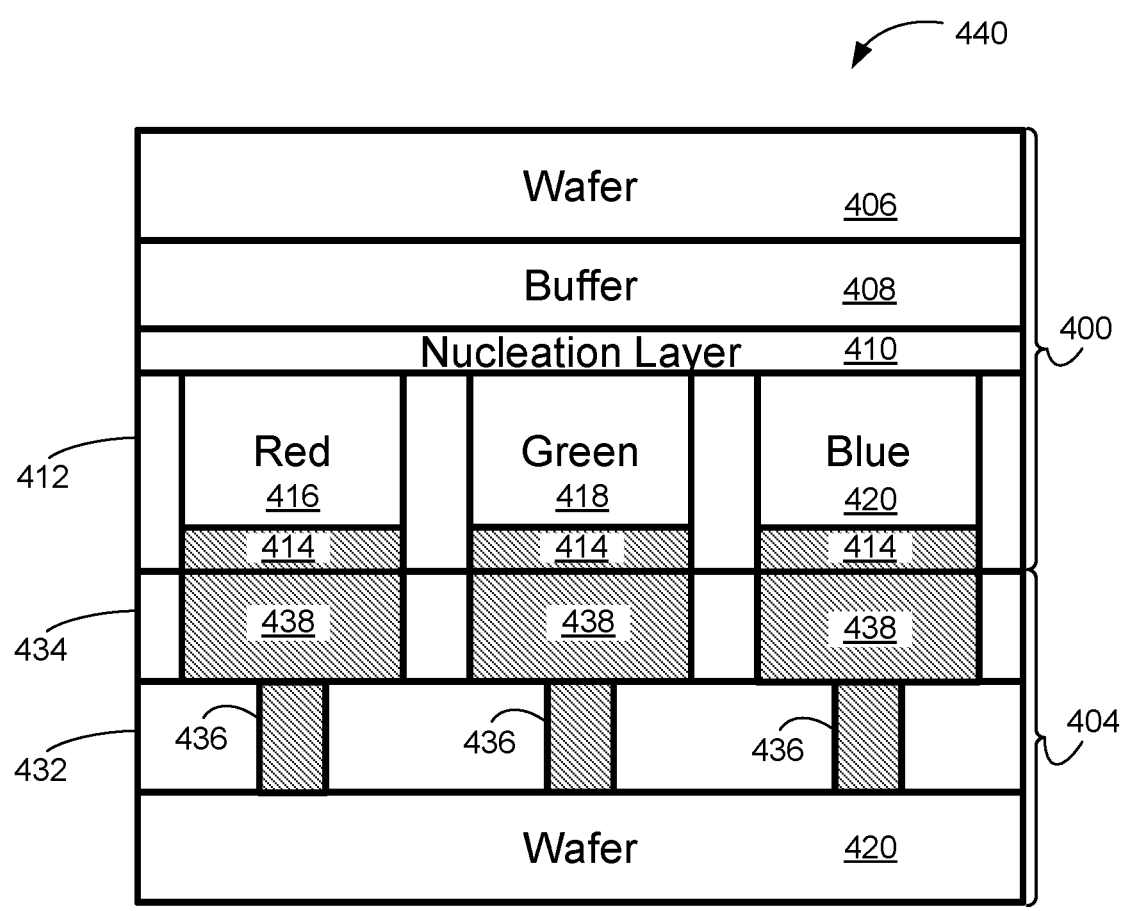
FIG. 5 schematically illustrates a cross-sectional side view of the wafer assemblies shown in FIGS. 4A-4B after wafer bonding, in accordance with various embodiments.

FIG. 5 schematically illustrates a cross-sectional side view of the wafer assemblies 400 and 404 shown in FIG. 4 after wafer bonding to form a bonded wafer assembly 440, in accordance with various embodiments. In some embodiments, the first wafer assembly 400 may be bonded to the second wafer assembly 404 using a wafer bonding process such that the driver circuit arrays of the second wafer assembly 404 are aligned with the array of light emitters 402 of the first wafer assembly 400. In various embodiments, the metal regions 414 of the first wafer assembly 400 may be aligned with the metal regions 438 of the second wafer assembly 404. In various embodiments, the first wafer assembly 400 may be bonded to the second wafer assembly 404 such that metal to metal bonds are formed between the metal regions 414 and the metal regions 438. In some embodiments, the metal to metal bonds may be copper to copper bonds. In some embodiments, the first wafer assembly 400 and the second wafer assembly 404 may be aligned with an alignment accuracy of less than or equal to approximately 5 µm.

Figure 6:
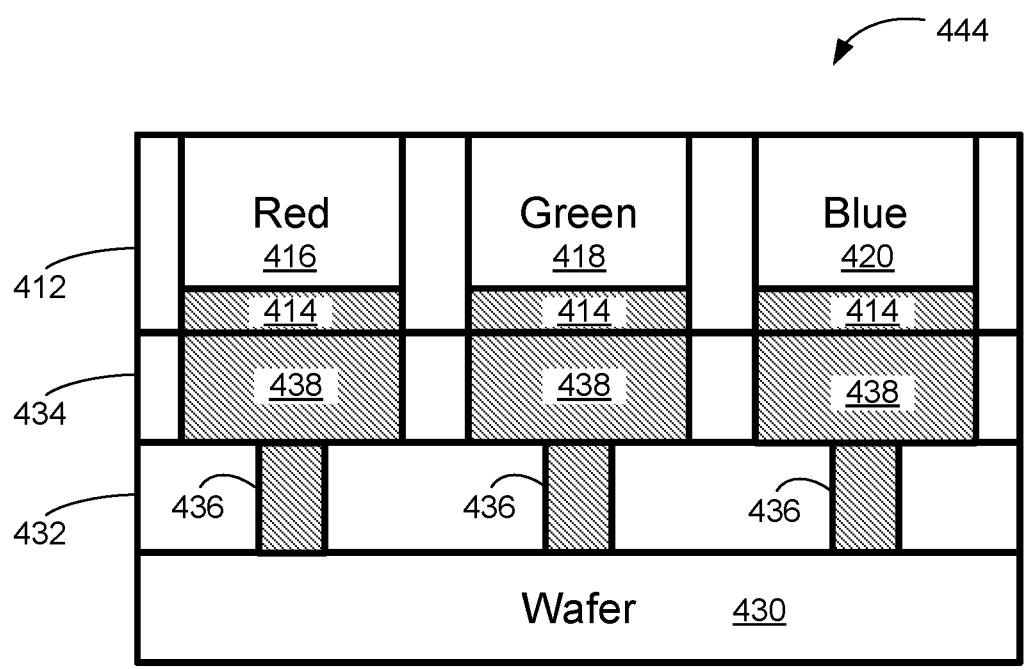
FIG. 6 schematically illustrates a cross-sectional side view of the bonded wafer assembly shown in FIG. 5 after removal of layers from the first wafer assembly, in accordance with various embodiments.

FIG. 6 schematically illustrates a cross-sectional side view of the bonded wafer assembly 440 shown in FIG. 5 after removal of layers from the first wafer assembly 400 to form a bonded wafer assembly 444, in accordance with various embodiments. As shown, the wafer 406, the buffer 408, and the nucleation layer 410 have been removed in accordance with some embodiments. In other embodiments, a different number or type of layers may be removed. In some embodiments, the array of light emitters 402 may be exposed in the bonded wafer assembly 444 such that they may emit light in a direction away from the wafer 430.

Figure 7:
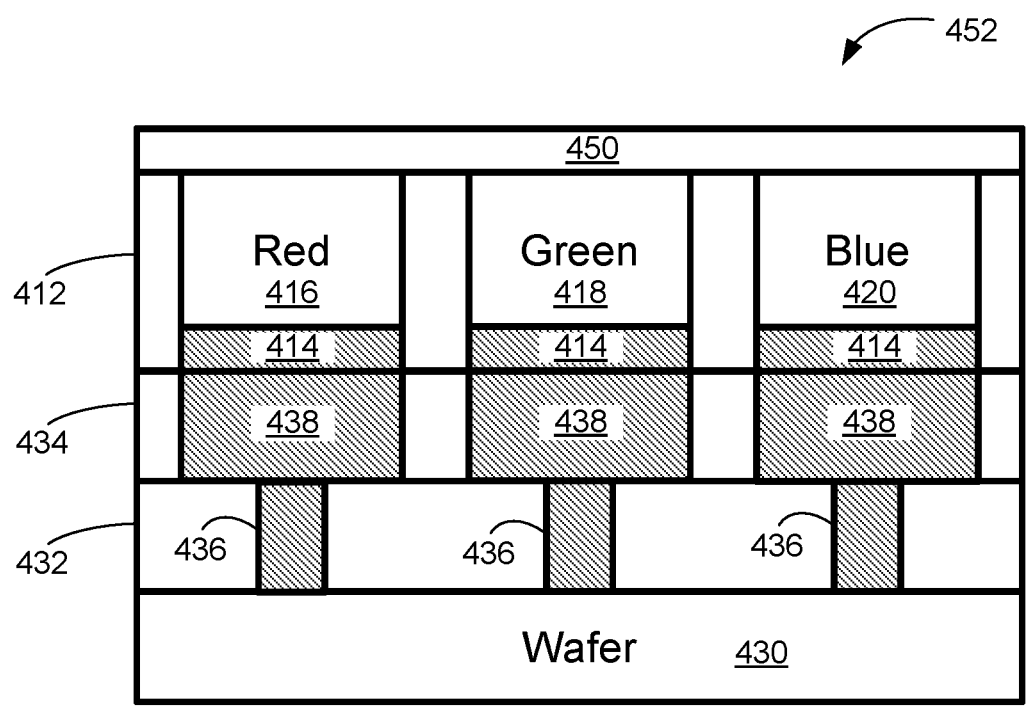
FIG. 7 schematically illustrates a cross-sectional side view of the bonded wafer assembly shown in FIG. 6 after deposition of a transparent electrode layer, in accordance with various embodiments.

FIG. 7 schematically illustrates a cross-sectional side view of the bonded wafer assembly 444 shown in FIG. 6 after deposition of a transparent electrode layer 450 to form a light emitting display 452, in accordance with various embodiments. In embodiments, the transparent electrode layer 450 may include cathodes for the light emitters in the array of light emitters 402. In some embodiments, the light emitting display 452 may correspond to the light emitting display 200 of FIG. 2. In various embodiments, the bonded wafer assembly 444 may be diced or singulated in another manner after deposition of the transparent electrode layer 450 to obtain one or more light emitting displays 452 from the bonded wafer assembly 444.

Figure 8:
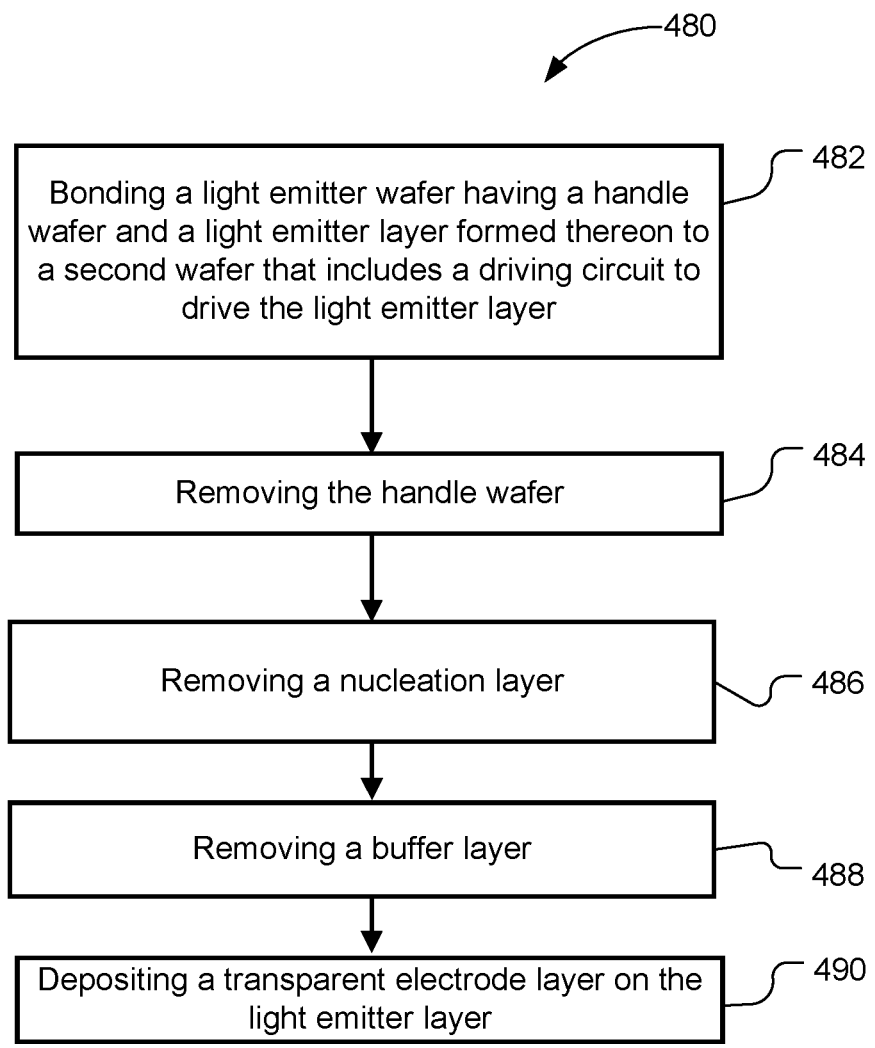
FIG. 8 schematically illustrates a flow diagram for a process of fabricating a light emitting display, in accordance with various embodiments.

FIG. 8 schematically illustrates a flow diagram for a process 480 of fabricating a light emitting display (e.g., light emitting display 200 of FIG. 2 or light emitting display 452 of FIG. 7), in accordance with various embodiments. In some embodiments, at a block 482, the process 480 may include bonding a light emitter wafer assembly (e.g., wafer assembly 100 or 400) having a handle wafer (e.g., wafer 406) and a light emitter layer (e.g., interlayer dielectric layer 412 with array of light emitters 402) formed thereon to a second wafer (e.g., wafer 430) that includes a driving circuit to drive the light emitter layer. In various embodiments, the light emitter wafer assembly may be bonded to the second wafer using a wafer bonding process. At a block 484, the process 480 may include removing the handle wafer (e.g., wafer 406), in accordance with some embodiments (e.g., using a polishing and/or wet etch process). In various embodiments, the process 480 may include removing a nucleation layer (e.g., nucleation layer 410) at a block 486. In some embodiments, at a block 488, the process 482 may include removing a buffer layer (e.g., buffer layer 408). At a block 490, the process 480 may include depositing a transparent electrode layer (e.g., transparent electrode layer 450) on the light emitter layer.

Figure 9:
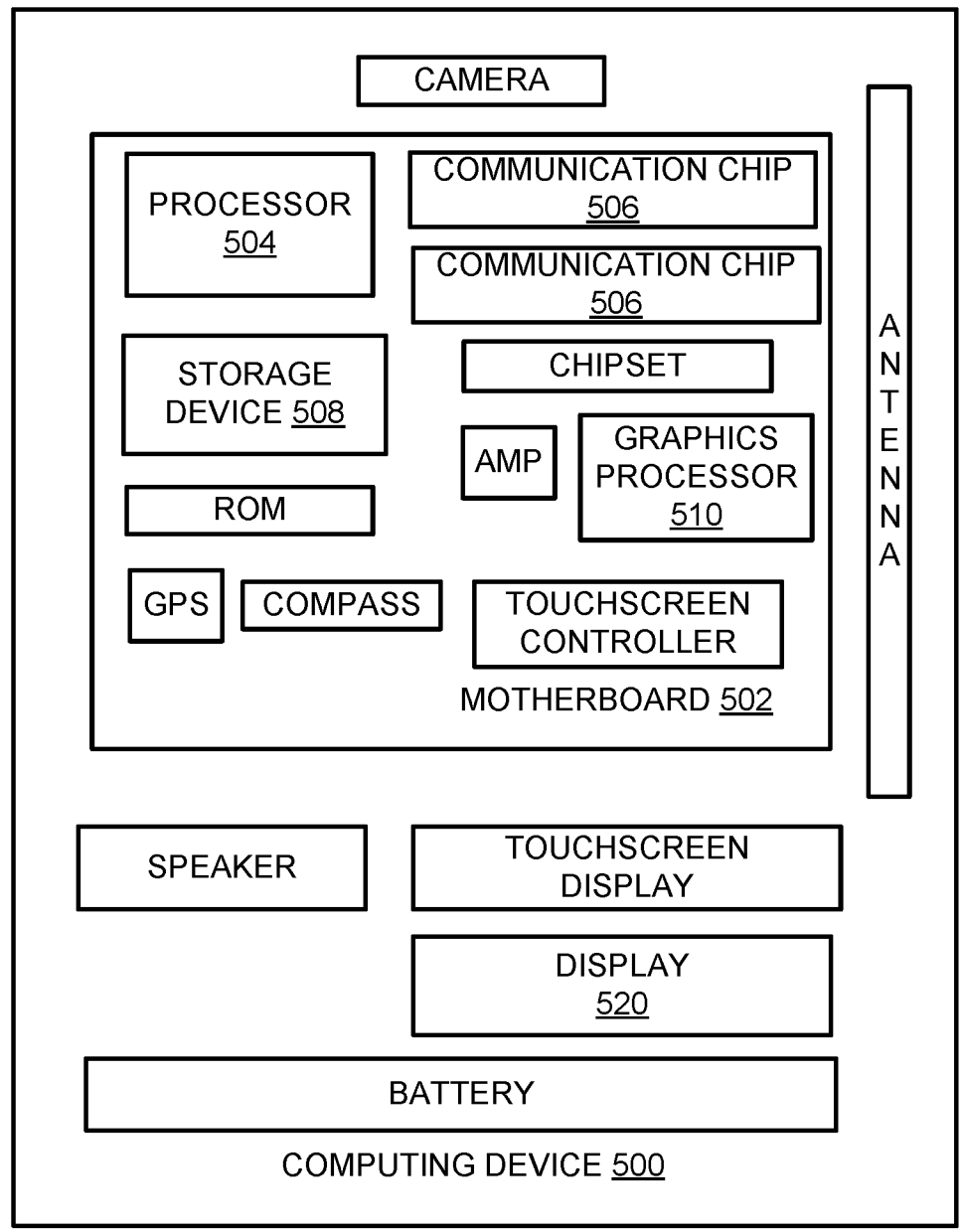
FIG. 9 schematically illustrates a computing device that may include the light emitting display of FIG. 1, FIG. 2, FIG. 3, and/or FIG. 7, in accordance with various embodiments.

FIG. 9 schematically illustrates a computing device 500 that may include the light emitting display of FIG. 1, the light emitting display 200 of FIG. 2, the light emitting display 300 of FIG. 3, and/or the light emitting display 452 of FIG. 7, in accordance with various embodiments. The computing device 500 may be, for example, an AR headset, a VR headset, a mobile communication device or a desktop or rack-based computing device. The computing device 500 may house a board such as a motherboard 502. The motherboard 502 may include a number of components, including (but not limited to) a processor 504 and at least one communication chip 506.

The computing device 500 may include a storage device 508 that may be coupled with the processor 504 and/or other components of the computing device 500. In some embodiments, the storage device 508 may include one or more solid state drives. Examples of storage devices that may be included in the storage device 508 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 500 may include other components that may or may not be physically and electrically coupled to the motherboard 502. These other components may include, but are not limited to, a graphics processor 510, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 506 and the antenna may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, EV-DO, and others. In some embodiments, the communication chip 506 may support wired communications. For example, the computing device 500 may include one or more wired servers.

The processor 504 and/or the communication chip 506 of the computing device 500 may include one or more dies or other components in an IC package. Such an IC package may be coupled with an interposer or another package. The term "processor" may refer to any device or portion of a device that processes electronic data from registers and/or memory to transform that electronic data into other electronic data that may be stored in registers and/or memory. In various embodiments, the computing device 500 may include a display 520 that may correspond to the light emitting display of FIG. 1, the light emitting display 200 of FIG. 2, the light emitting display 300 of FIG. 3, and/or the light emitting display 452 of FIG. 7. In some embodiments, the display 520 may be coupled with the processor 504 and/or the graphics processor 510, connections not shown for clarity. In some embodiments, the display 520 may be coupled with the processor 504 via the graphics processor 510. In some embodiments, a driving circuit (e.g., driving circuit 106 or 204) of the display 520 may be coupled with the processor 502 and/or the graphics processor 510. In some embodiments, the computing device 500 may include one or more of the components or a subset of the components shown in FIG. 9.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data and includes or is communicatively coupled with a display device in accordance with embodiments described herein, for example, a head mounted display device described below.

Figure 10:
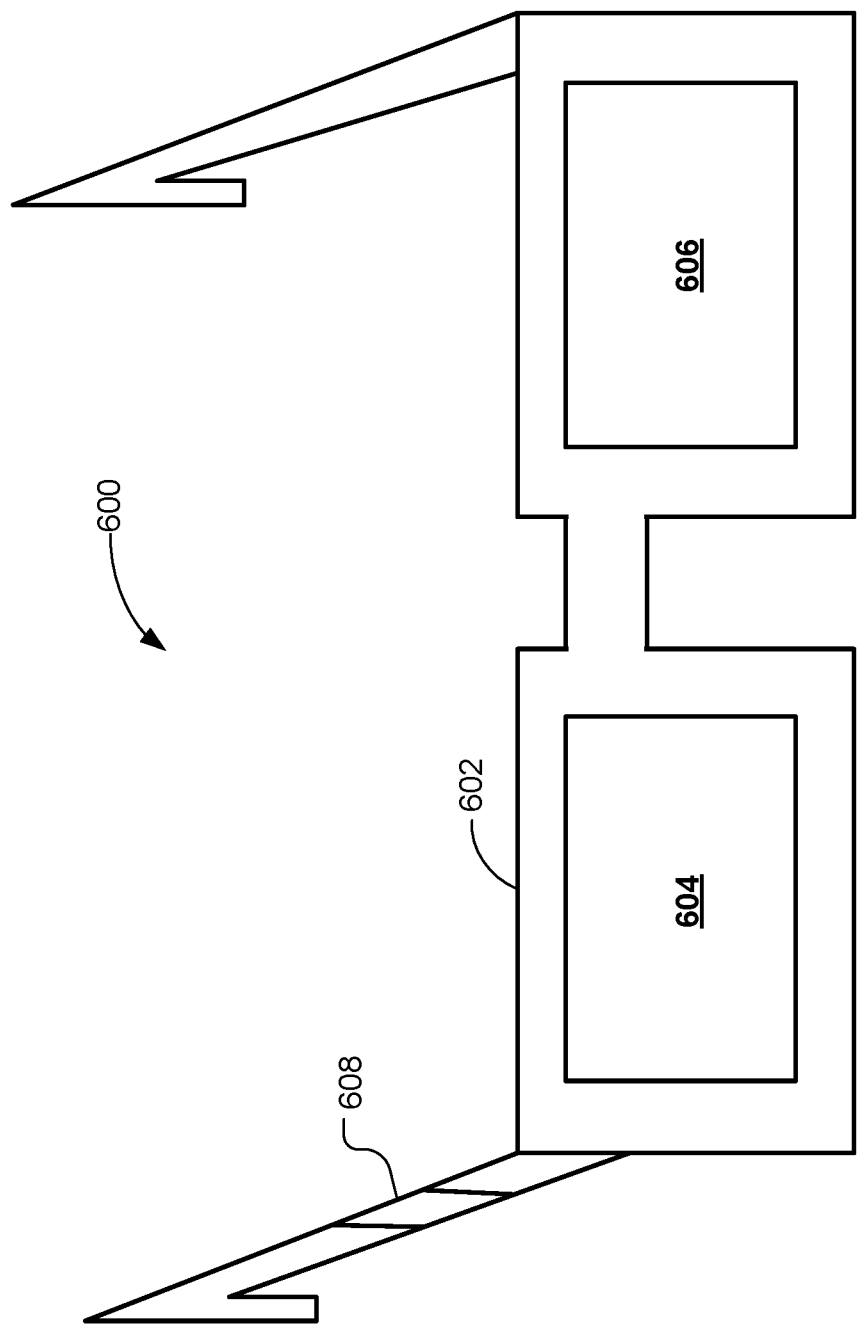
FIG. 10 is a simplified schematic representation of a head mounted display device that may include the light emitting display of FIG. 1, FIG. 2, FIG. 3, and/or FIG. 7, in accordance with various embodiments.

FIG. 10 is a simplified schematic representation of a head mounted display device 600 that may include the light emitting display 200 of FIG. 2, the light emitting display 300 of FIG. 3, the light emitting display 452 of FIG. 7, and/or the display 520 of FIG. 9, in accordance with various embodiments. In some embodiments, the head mounted display device 600 may include a mount 602 to be positioned on a head of a user, a first light emitting display 604, and a second light emitting display 606 that may be coupled with the mount 602 such that the light emitting displays are to be positioned proximate to a user's eyes when the mount 602 is positioned on the user's head. In some embodiments, the mount 602 may be included in the frame of a pair of glasses, a pair of goggles, a visor, or some other head mounted display device. In some embodiments, a different number of light emitting displays may be used. In various embodiments, an electronics module 608 may be coupled with and/or in signal communication with the first light emitting display 604 and the second light emitting display 606. In some embodiments, the electronics module 608 may include processing and/or communication components such as some or all of those described with respect to the computing device 500 of FIG. 9 (e.g., processor 504, communication chip 506, storage device 508, graphics processor 510) and/or a power supply such as a battery. In various embodiments, the head mounted display device 600 may include a single light emitting display rather than individual light emitting displays for each eye. In some embodiments, the head mounted display device 600 may be in signal communication with a computing device such as the computing device 500 and/or may serve as a display device for the computing device.

The following paragraphs provide examples of various ones of the embodiments disclosed herein.

Example 1 may include a light emitting display apparatus comprising: a light emitter layer that includes an array of light emitters; and a wafer coupled with the light emitter layer, wherein the wafer includes a driving circuit formed thereon to drive the light emitters.

Example 2 may include the subject matter of Example 1, further comprising a first dielectric layer bonded with the light emitter layer having a first plurality of metal regions formed therein, wherein the light emitter layer is formed in a second dielectric layer having a second plurality of metal regions formed therein, wherein more than one metal region of the first plurality of metal regions is coupled with a corresponding metal region of the second plurality of metal regions.

Example 3 may include the subject matter of Example 2, wherein the metal regions in the second plurality of metal regions are anodes for the array of light emitters.

Example 4 may include the subject matter of any one of Examples 1-3, wherein the light emitter layer includes a transparent electrode layer.

Example 5 may include the subject matter of any one of Examples 1-4, wherein the light emitters are light emitting diodes.

Example 6 may include the subject matter of Example 5, wherein the light emitting diodes have Indium Gallium Nitride active layers.

Example 7 may include the subject matter of any one of Examples 1-6, wherein the light emitting display apparatus is a computing device further comprising a processor coupled with the driving circuit.

Example 8 may include the subject matter of any one of Examples 1-7, wherein the driving circuit is formed with complementary metal oxide semiconductor (CMOS) transistors or thin film transistors (TFTs).

Example 9 may include the subject matter of any one of Examples 1-8, wherein the array of light emitters has a pitch of less than or equal to 5 micrometers and the wafer is a silicon, sapphire, silicon carbide, or gallium nitride wafer.

Example 10 may include a method comprising: bonding a light emitter wafer having a handle wafer and a light emitter layer formed thereon to a second wafer that includes a driving circuit to drive the light emitter layer; and removing the handle wafer.

Example 11 may include the subject matter of Example 10, wherein the light emitter wafer includes a buffer layer and the method further comprises removing the buffer layer.

Example 12 may include the subject matter of any one of Examples 10-11, wherein the light emitter wafer includes a nucleation layer and the method further comprises removing the nucleation layer.

Example 13 may include the subject matter of any one of Examples 10-12, further comprising depositing a transparent electrode layer on the light emitter layer.

Example 14 may include the subject matter of Example 13, wherein the transparent electrode layer is a cathode layer.

Example 15 may include the subject matter of any one of Examples 10-14, wherein the light emitter layer includes an array of light emitting diodes in a dielectric layer.

Example 16 may include the subject matter of any one of Examples 10-15, wherein the driving circuit is formed with complementary metal oxide semiconductor (CMOS) transistors or thin film transistors (TFTs).

Example 17 may include the subject matter of any one of Examples 10-16, wherein the light emitter layer is formed in a first dielectric layer having a first plurality of metal regions formed therein, the second wafer includes a second dielectric layer having a second plurality of metal regions formed therein, and wherein bonding the light emitter wafer to the second wafer includes bonding more than one metal region of the first plurality of metal regions with a corresponding metal region of the second plurality of metal regions.

Example 18 may include the subject matter of any one of Examples 10-17, wherein the light emitter wafer includes an array of light emitters that have a pitch of less than or equal to 5 micrometers.

Example 19 may include a head mounted display device comprising: a mount to be positioned on a head of a user; and a light emitting display coupled with the mount such that the light emitting display is to be positioned proximate the user's eyes when the mount is positioned on the user's head, wherein the light emitting display includes: a light emitter layer that includes an array of light emitters; and a wafer coupled with the light emitter layer, wherein the wafer includes a driving circuit formed thereon to drive the light emitters.

Example 20 may include the subject matter of Example 19, further comprising a first dielectric layer bonded with the light emitter layer having a first plurality of metal regions formed therein, wherein the light emitter layer is formed in a second dielectric layer having a second plurality of metal regions formed therein, wherein more than one metal region of the first plurality of metal regions is coupled with a corresponding metal region of the second plurality of metal regions.

Example 21 may include the subject matter of any one of Examples 19-20, wherein the array of light emitters has a pitch of less than or equal to 5 micrometers.

Example 22 may include the subject matter of any one of Examples 19-21, wherein the light emitters are light emitting diodes having Indium Gallium Nitride active layers.

Example 23 may include the subject matter of any one of Examples 19-22, wherein the light emitter layer includes a transparent electrode layer and the driving circuit is formed with complementary metal oxide semiconductor (CMOS) transistors or thin film transistors (TFTs).

Example 24 may include the subject matter of any one of Examples 19-23, wherein the head mounted display device is an augmented reality display device.

Example 25 may include the subject matter of any one of Examples 19-23, wherein the head mounted display device is a virtual reality display device.

What is claimed is:
1. A light emitting display apparatus comprising:
   a first wafer assembly that includes:
      a first dielectric layer;
      a light emitter layer with an array of light emitters disposed in the first dielectric layer, wherein the array includes at least a red light emitter, a green light emitter, and a blue light emitter; and
      a first plurality of metal regions disposed in the first dielectric layer, wherein each of the first plurality of metal regions is disposed directly underneath, and coupled with, a corresponding one of the red, green, or blue light emitter, wherein the metal regions in the first plurality of metal regions are anodes for respective light emitters of the array of light emitters; and
   a second wafer assembly disposed directly on the first wafer assembly, wherein the second wafer assembly comprises a driving circuit formed thereon to drive the array of light emitters, wherein the second wafer assembly includes:
      a wafer layer that comprises silicon;
      a first interlayer dielectric layer provided directly on the wafer layer;
      a plurality of vias that run through the first dielectric layer;
      a second interlayer dielectric layer provided directly on the first interlayer dielectric layer and coupled with the first interlayer dielectric layer; and
      a second plurality of metal regions disposed in the second dielectric layer, wherein each of the plurality of vias of the first interlayer dielectric layer is coupled with a respective one of the second plurality of metal regions of the second interlayer dielectric layer and with the wafer layer,
   wherein the first wafer assembly is bonded with the second wafer assembly such that each of the first plurality of metal regions is coupled and aligned with a respective one of the second plurality of metal regions through metal-to-metal bonds, wherein a first width of one of the first plurality of metal regions is substantially the same as a second width of one of the second plurality of metal regions, wherein the first wafer assembly and the second wafer assembly are aligned with an alignment accuracy of less than or equal to approximately 5 µm.

2. The light emitting display apparatus of claim 1, wherein the light emitter layer includes a transparent electrode layer.

3. The light emitting display apparatus of claim 1, wherein the light emitters are light emitting diodes.

4. The light emitting display apparatus of claim 3, wherein the light emitting diodes have Indium Gallium Nitride active layers.

5. The light emitting display apparatus of claim 1, wherein the light emitting display apparatus is a computing device further comprising a processor coupled with the driving circuit.

6. The light emitting display apparatus of claim 1, wherein the driving circuit is formed with complementary metal oxide semiconductor (CMOS) transistors or thin film transistors (TFTs).

7. The light emitting display apparatus of claim 1, wherein the array of light emitters has a pitch of less than or equal to 5 micrometers and the wafer is a silicon, sapphire, silicon carbide, or gallium nitride wafer.

8. A method comprising:
forming a first wafer assembly, which includes:
providing a first dielectric layer;
disposing a light emitter layer with an array of light emitters in the first dielectric layer, wherein the array includes at least a red light emitter, a green light emitter, and a blue light emitter; and
disposing a first plurality of metal regions in the first dielectric layer, wherein each of the first plurality of metal regions is disposed directly underneath, and coupled with, a corresponding one of the red, green, or blue light emitter, wherein the metal regions in the first plurality of metal regions are anodes for respective light emitters of the array of light emitters;
forming a second wafer assembly directly on the first wafer assembly, wherein the second wafer assembly comprises a driving circuit formed thereon to drive the array of light emitters, wherein forming the second wafer assembly includes:
providing a wafer layer that comprises silicon;
providing a first interlayer dielectric layer directly on the wafer layer;
forming a plurality of vias to run through the first dielectric layer;
providing a second interlayer dielectric layer directly on the first interlayer dielectric layer, and coupling the second interlayer dielectric layer with the first interlayer dielectric layer; and
disposing a second plurality of metal regions in the second dielectric layer, including coupling each of the plurality of vias of the first interlayer dielectric layer with a respective one of the second plurality of metal regions of the second interlayer dielectric layer and with the wafer layer; and
bonding the first wafer assembly with the second wafer assembly, including coupling and aligning each of the first plurality of metal regions with a respective one of the second plurality of metal regions through metal-to-metal bonds, to align the first wafer assembly and the second wafer assembly with an alignment accuracy of less than or equal to approximately 5 μm, wherein a first width of one of the first plurality of metal regions is substantially the same as a second width of one of the second plurality of metal regions.

9. The method of claim 8, wherein a light emitter wafer of the first wafer assembly includes a buffer layer and the method further comprises removing the buffer layer.

10. The method of claim 9, wherein the light emitter wafer includes a nucleation layer and the method further comprises removing the nucleation layer.

11. The method of claim 9, wherein the light emitter wafer includes an array of light emitters that have a pitch of less than or equal to 5 micrometers.

12. The method of claim 8, further comprising depositing a transparent electrode layer on the light emitter layer.

13. The method of claim 12, wherein the transparent electrode layer is a cathode layer.

14. The method of claim 8, wherein the light emitter layer includes an array of light emitting diodes.

15. The method of claim 8, wherein the driving circuit is formed with complementary metal oxide semiconductor (CMOS) transistors or thin film transistors (TFTs).

16. A head mounted display device comprising:
a mount to be positioned on a head of a user; and
a light emitting display coupled with the mount such that the light emitting display is to be positioned proximate the user's eyes when the mount is positioned on the user's head, wherein the light emitting display comprises:
a first wafer assembly includes:
a first dielectric layer;
a light emitter layer that includes with an array of light emitters disposed in the first dielectric layer, wherein the array includes at least a red light emitter, a green light emitter, and a blue light emitter; and
a first plurality of metal regions disposed in the first dielectric layer, wherein each of the first plurality of metal regions is disposed directly underneath, and coupled with, a corresponding one of the red, green, or blue light emitter, wherein the metal regions in the first plurality of metal regions are anodes for respective light emitters of the array of light emitters; and
a second wafer assembly disposed directly on the first wafer assembly coupled with the light emitter layer, wherein the second wafer assembly comprises a driving circuit formed thereon to drive the array of light emitters, wherein the second wafer assembly includes:
a wafer layer that comprises silicon;
a first interlayer dielectric layer provided directly on the wafer layer;
a plurality of vias that run through the first dielectric layer;
a second interlayer dielectric layer provided directly on the first interlayer dielectric layer and coupled with the first interlayer dielectric layer; and
a second plurality of metal regions disposed in the second dielectric layer, wherein each of the plurality of vias of the first interlayer dielectric layer is coupled with a respective one of the second plurality of metal regions of the second interlayer dielectric layer and with the wafer layer,
wherein the first wafer assembly is bonded with the second wafer assembly such that each of the first plurality of metal regions is coupled and aligned with a respective one of the second plurality of metal regions through metal-to-metal bonds, wherein a first width of one of the first plurality of metal regions is substantially the same as a second width of one of the second plurality of metal regions, wherein the first wafer assembly and the second wafer assembly are aligned with an alignment accuracy of less than or equal to approximately 5 μm.

17. The head mounted display device of claim 16, wherein the array of light emitters has a pitch of less than or equal to 5 micrometers.

18. The head mounted display device of claim 16, wherein the light emitters are light emitting diodes having Indium Gallium Nitride active layers.

19. The head mounted display device of claim 16, wherein the light emitter layer includes a transparent electrode layer and the driving circuit is formed with complementary metal oxide semiconductor (CMOS) transistors or thin film transistors (TFTs).

20. The head mounted display device of claim 16, wherein the head mounted display device is an augmented reality display device.

21. The head mounted display device of claim 16, wherein the head mounted display device is a virtual reality display device.

* * * * *

UNITED STATES PATENT AND TRADEMARK OFFICE
CERTIFICATE OF CORRECTION

| | |
|---|---|
| PATENT NO. | : 11,275,245 B2 |
| APPLICATION NO. | : 16/473983 |
| DATED | : March 15, 2022 |
| INVENTOR(S) | : Khaled Ahmed and Ali Khakifirooz |

It is certified that error appears in the above-identified patent and that said Letters Patent is hereby corrected as shown below:

In the Claims

Column 12
Line 8, "… assembly includes" should read -- … assembly that includes --

Signed and Sealed this
Thirtieth Day of August, 2022

Katherine Kelly Vidal
*Director of the United States Patent and Trademark Office*